(12) United States Patent
Kim (10) Patent No.: US 6,677,794 B2
(45) Date of Patent: Jan. 13, 2004

(54) CLOCK SYNCHRONIZATION DEVICE

(75) Inventor: Se Jun Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/330,863

(22) Filed: Dec. 27, 2002

(65) Prior Publication Data

US 2003/0122599 A1 Jul. 3, 2003

(30) Foreign Application Priority Data

Dec. 28, 2001 (KR) .................................. 2001-86677

(51) Int. Cl.[7] .................................................. H03L 7/00
(52) U.S. Cl. ..................................................... 327/161
(58) Field of Search ........................ 327/141, 153–155, 327/161, 163, 105, 291, 294, 298; 375/354, 362; 370/503, 517, 519, 520

(56) References Cited

U.S. PATENT DOCUMENTS 5,552,726 A * 9/1996 Wichman et al. ........... 327/149
6,101,197 A * 8/2000 Keeth et al. ................. 370/517
6,373,913 B1 * 4/2002 Lee ............................. 375/376
6,441,662 B2 * 8/2002 Ikeda .......................... 327/160

* cited by examiner

Primary Examiner—My-Trang Nu Ton
(74) Attorney, Agent, or Firm—Marshall, Gerstein & Borun LLP (57) ABSTRACT

A clock synchronization device includes: a coarse delay line arranged to sequentially delay an external clock signal and output one or more pairs of first multi-phase clock signals and one or more pairs of second multi-phase clock signals; a clock interface arranged to select a pair of clock signals having opposite phases from among the one or more pairs of first multi-phase clock signals and the one or more pairs of second multi-phase clock signals and further arranged to synthesize the phase of a pair of the selected clock signals; and a fine delay line arranged to finely delay the pair the selected clock signals from the clock interface and output an internal clock signal synchronized with the external clock signal.

10 Claims, 11 Drawing Sheets

CLOCK SYNCHRONIZATION DEVICE

FIELD OF THE TECHNOLOGY

The disclosed device generally relates to clock synchronization devices for removing skews of clock signals, and more particularly, to a clock synchronization device which can reduce initial synchronization time by using a feed-forward type duty corrector circuit.

DESCRIPTION OF THE RELATED ART

Figure 1:
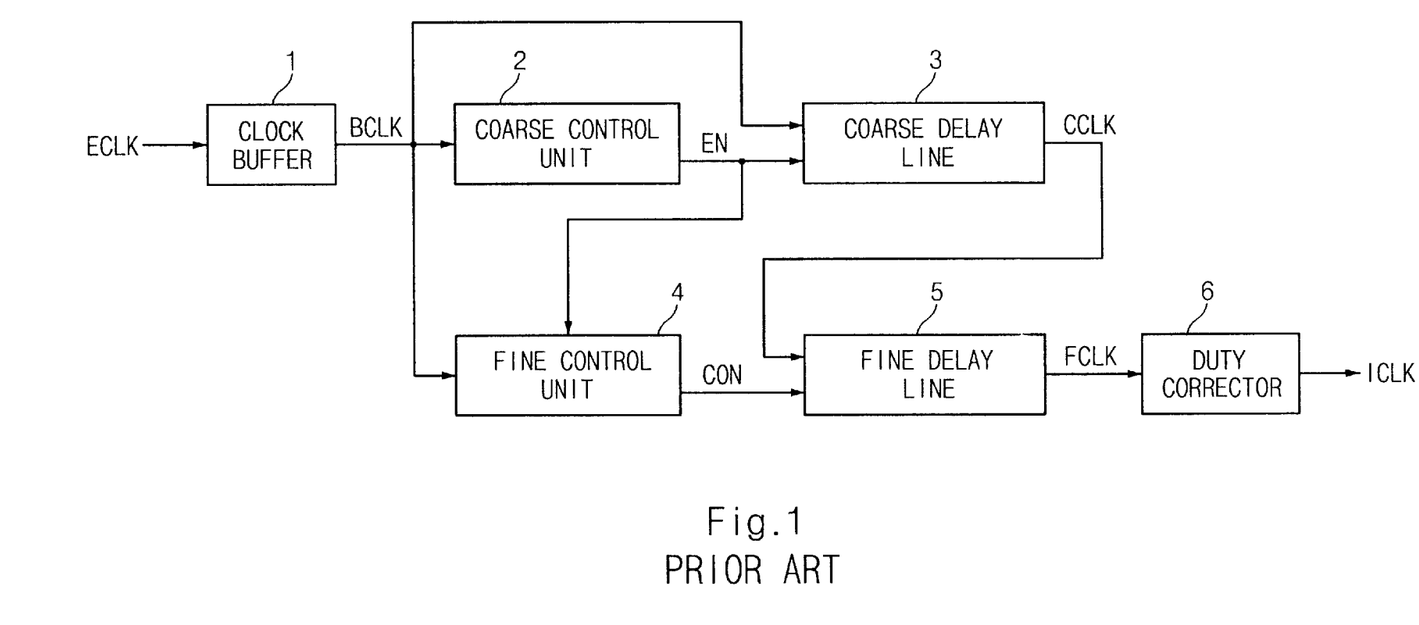
FIG. 1 is a block diagram illustrating a conventional clock synchronization device.

Referring to FIG. 1 a block diagram illustrating a conventional clock synchronization device is disclosed, and a hierarchical phase locking delay ('HPLD') circuit is described. The conventional clock synchronization device includes a clock buffer 1, a coarse control unit 2, a coarse delay line 3, a fine control unit 4, a fine delay line 5 and a duty corrector 6.

The clock buffer 1 transmits external clock signals (ECLK) into an internal circuitry. The coarse delay line 3, including several unit coarse delay cells connected in series, delays the clock signals (BCLK) transmitted from the clock buffer 1 for a predetermined time and then outputs coarse delay clock signals (CCLK). The coarse control unit 2 adjusts the delay time of the coarse delay line 3 via enable signals EN.

The fine delay line 5 includes several unit fine delay cells connected in series. The fine delay line 5 delays coarse delay clock signals CCLK outputted from the coarse delay line 3 for a predetermined time and then outputs fine clock signals FCLK. The delay time of unit fine delay cells is smaller than that of unit coarse delay cells in the coarse delay line 3, thereby providing a more finely delayed signal. The fine control unit 4 adjusts the delay time of the fine delay line 5 according to control signals (CON).

The duty corrector 6 adjusts the duty cycle of the fine delay clock signals FCLK outputted from the fine delay line 5, and then outputs internal clock signals ICLK. A feedback type duty corrector 6 uses the principle that the whole current difference between the high time interval and the low time interval of the clock signal is '0' in the case of clock signals maintaining a duty-ratio of 50%.

Figure 2:
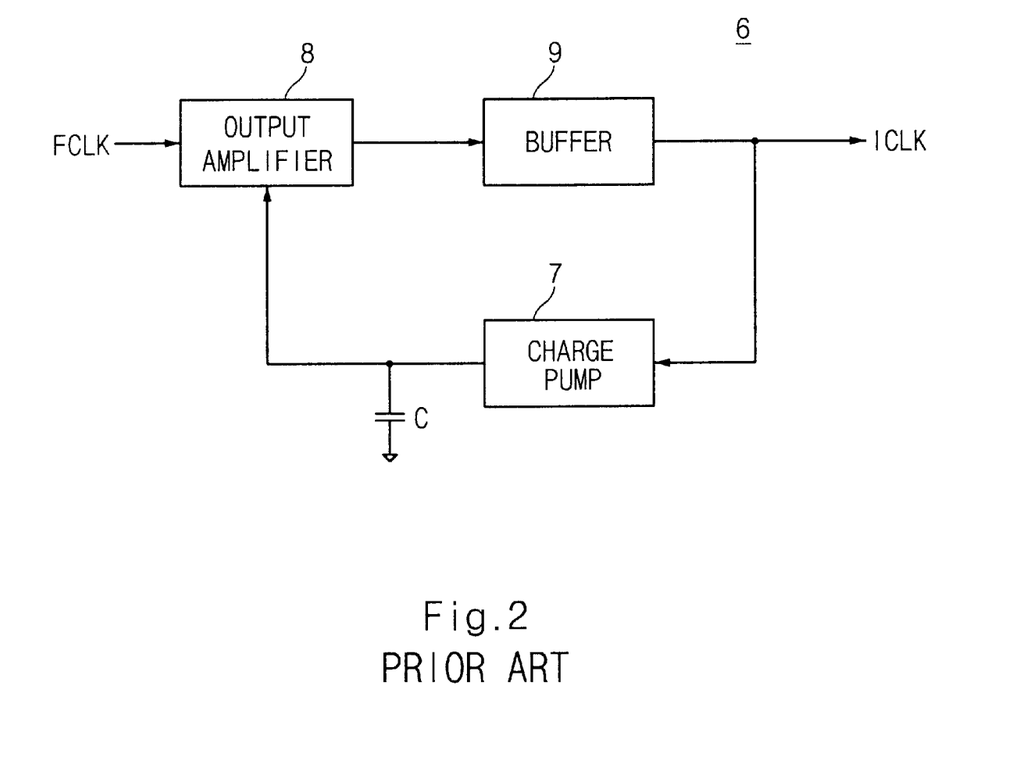
FIG. 2 is a detailed block diagram illustrating a duty corrector of FIG. 1.

FIG. 2 is a more detailed block diagram illustrating the duty corrector 6 of the conventional clock synchronization device described above. The duty corrector 6 includes a charge pump 7, a capacitor C, an output amplifier 8 and a buffer 9.

When an internal clock signal ICLK outputted from the duty corrector 6 is fed back to the charge pump 7, an output current charge from the charge pump 7 is stored in the capacitor C as a current valve according to the internal clock signal ICLK. The current value stored in the capacitor C is converted into a voltage value, and the voltage value is fed back to the output amplifier 8. As a result, output signals of the output amplifier 8 adjust the duty-ratio of the internal clock signals ICLK to 50% by transforming the common mode level of signals in the buffer 9 having small swing.

However, the duty corrector 6 used in the conventional clock synchronization device has long initial phase synchronization time due to the feed-back technique. In addition, according to the conventional clock synchronization device described above, jitter is not compensated for, DC currents are increased and information on the duty ratio is stored in the capacitor C as an analog value. As a result, the hold time is limited when the clock synchronization device is instantly stopped.

SUMMARY

A clock synchronization device is provided which includes: a coarse delay line; a coarse control unit; a clock interface; a fine delay line; a fine control unit; and a control unit. The coarse delay line delays an external clock signal and outputs one or more pairs of first multi-phase clock signals and one or more pairs of second multi-phase clock signals. The coarse control compares the phase of the external clock signal with the phase of an inverted clock signal from among the one or more pairs of first multi-phase clock signals to provide a comparison result. The coarse control also controls the coarse delay line according to the comparison result. The clock interface selects a pair of clock signals having opposite phases, from among the one or more pairs of first multi-phase clock signals and the one or more pairs of second multi-phase clock signals. The clock interface also synthesizes the phase of a pair of the selected clock signals. The fine delay line finely delays the pair of the selected clock signals from the clock interface and outputs an internal clock signal synchronized with the external clock signal. The fine control unit compares the phase of the external clock signal with the phase of the internal clock signal and controls the fine delay line according to a comparison result. The control unit compares the phase of the external clock signal with that of the internal clock signal and controls the clock interface according to a digital comparison result.

DETAILED DESCRIPTION OF THE EXAMPLES

Figure 3:
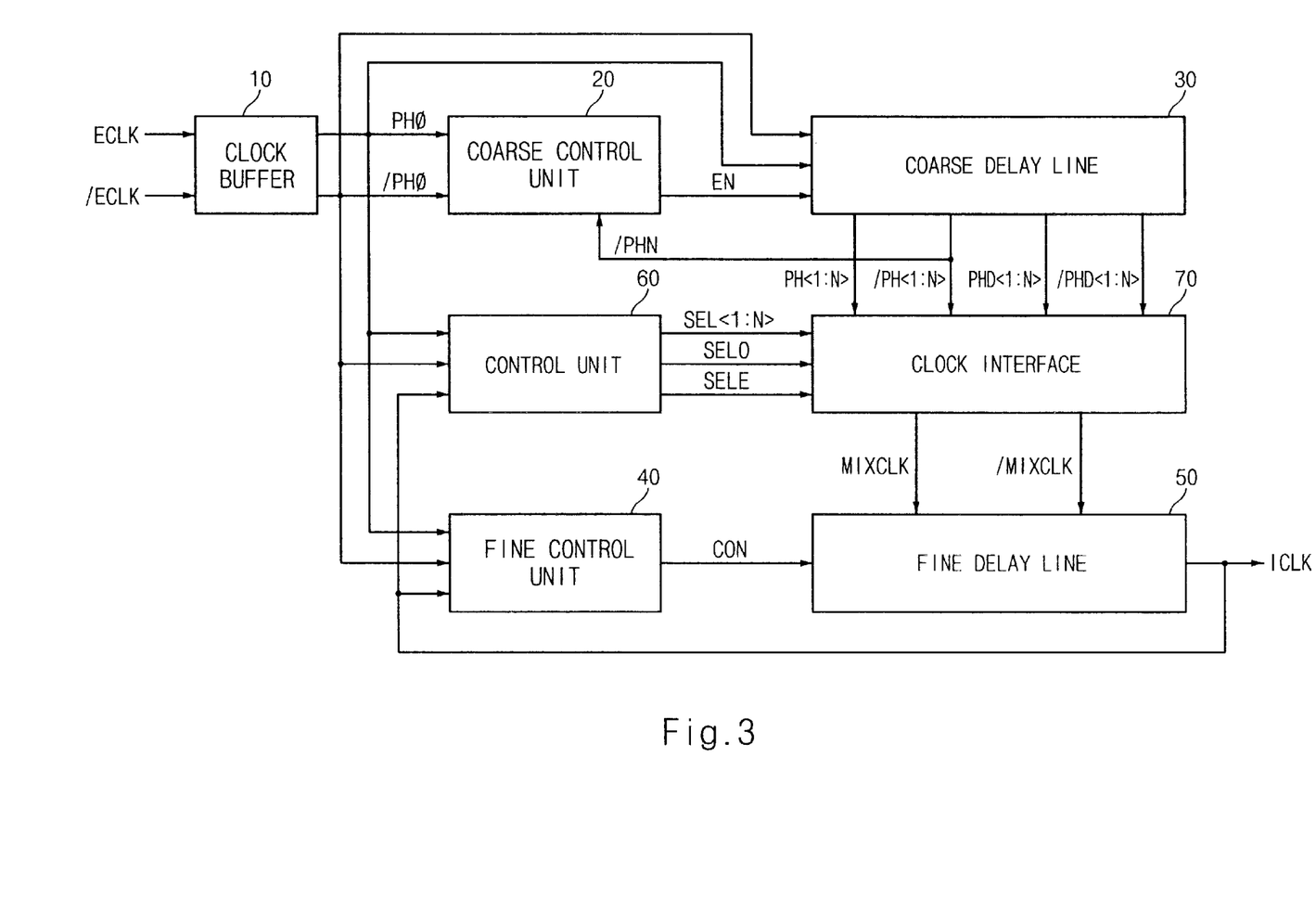
FIG. 3 is a block diagram illustrating an example of a clock synchronization device.

FIG. 3 is a block diagram illustrating generally an example of a preferred clock synchronization device. In the present example a hierarchical phase locking delay HPLD circuit is described, though, one of ordinary skill in the art will readily recognize that the disclosed device may be applicable to other types of clock synchronization devices.

The clock synchronization device according to the present example includes a clock buffer 10, a coarse control unit 20, a coarse delay line 30, a fine control unit 40, a fine delay line 50, a control unit 60 and a clock interface 70.

The clock buffer 10 transmits external clock signals ECLK and /ECLK into an internal circuitry. The coarse control unit 20 compares the phase of the external clock signal with the phase of an inverted clock signal from one of a pair of first multi-phase clock signals from the coarse delay line 30. The coarse control unit 20 controls the coarse delay line according to the comparison result via enable signals EN. The coarse delay line 30 sequentially delays the external clock signals ECLK and /ECLK and then outputs pairs of first multi-phase clock signals PH and /PH and pairs of second multi-phase clock signals PHD and /PHD.

The fine control unit 40 compares the phase of the external clock signal with that of an internal clock signal ICLK from the fine delay line 50 and then controls the fine delay line 50 according to the comparison result via control signals CON. The fine delay line 50 finely delays a pair of the clock signals MIXCLK and /MIXCLK from the clock interface 70 and then outputs the internal clock signal ICLK synchronized with the external reference clock signal. The control unit 60 compares the phase of the external clock signal with that of the internal clock signal ICLK from the fine delay line 50, and then outputs the comparison as a digital value, which is used to control the clock interface 70.

The clock interface 70 selects a pair of clock signals, each having a phase opposite to the phase of the other. The pair are selected from among a pair of the first multi-phase clock signals PH<1:N> and /PH<1:N> and a pair of the second multi-phase clock signals PHD<1:N> and /PHD<1:N> from the coarse delay line 30. The clock interface 70 then synthesizes the phase of the pair of the selected clock signals. That is, the clock signals are combined to generate a synthesized clock signal that has the middle phase of the two different phases of the two different clock signals.

Figure 4:
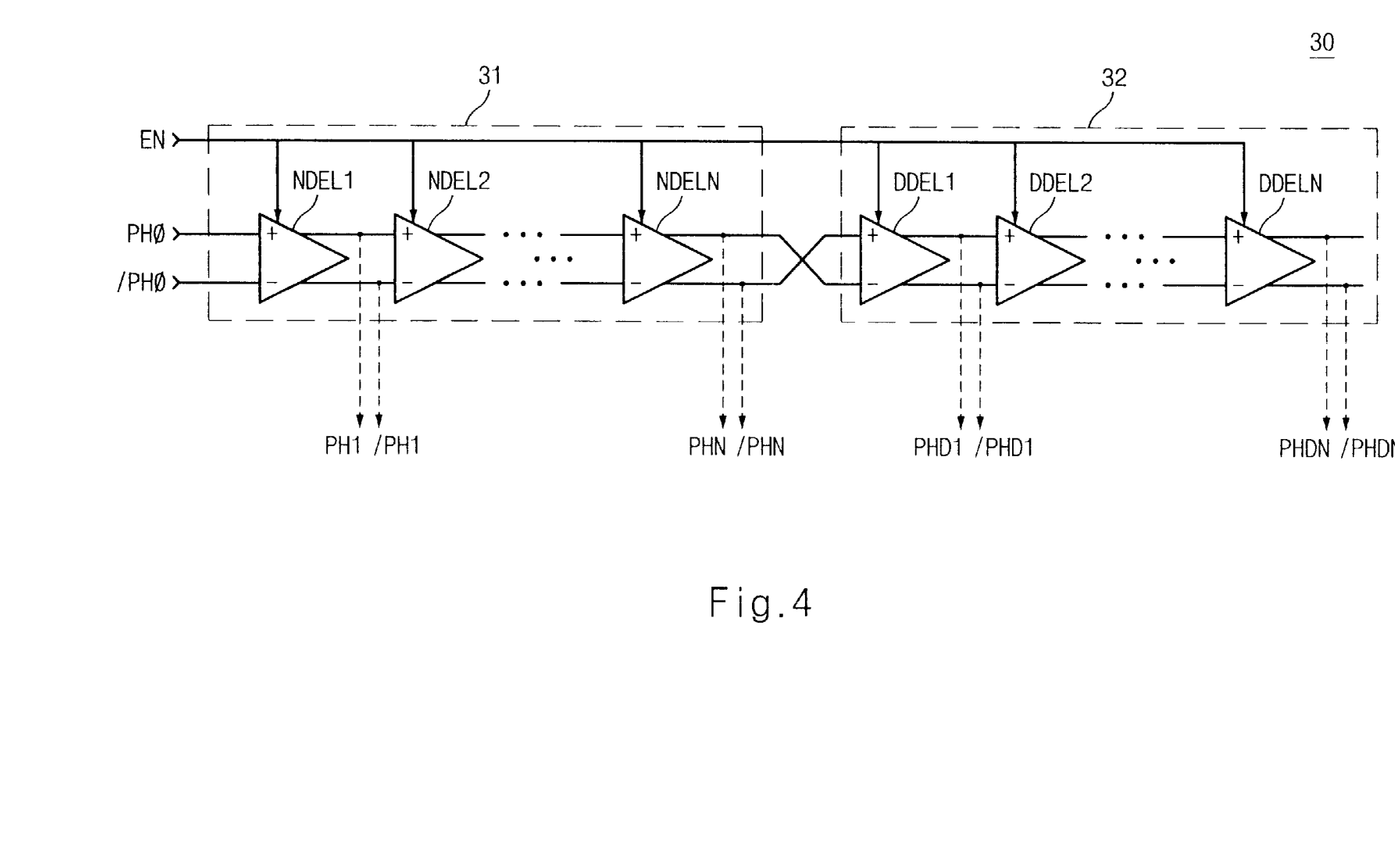
FIG. 4 is a detailed block diagram illustrating a coarse delay line of FIG. 3.

FIG. 4 is a detailed block diagram illustrating an example of the coarse delay line 30 of the clock synchronization device. The coarse delay line 30 includes two delay lines 31 and 32, each having the same number of differential delay cells, and controlled according to enable signals EN outputted from the coarse control unit 20. The delay line 31 is a normal delay line that includes several differential delay cells NDEL1–NDELN connected in series. The normal delay line 31 sequentially delays reference clock signals PH0 and /PH0 transmitted from the clock buffer 10 and then outputs normal multi-phase clock signals PH1-PHN and /PH1-/PHN.

The delay line 32 is a reverse delay line that includes several differential delay cells DDEL1–DDELN connected in series. The reverse delay line 32 sequentially delays the final output clock signals PHN and /PHN and then outputs reverse multi-phase clock signals PHD1–PHDN and /PHD1-/PHDN. The clock signals PHN and /PHN are outputted from the final differential delay cell NDELN in the series of differential delay cells of the normal delay line 31. The clock signals PHN and /PHN are then inputted into a reverse input terminal and a non-reverse input terminal, respectively, of the first differential delay cell DDEL1 in the series of differential delay cells of the reverse delay line 32.

Figure 5A:
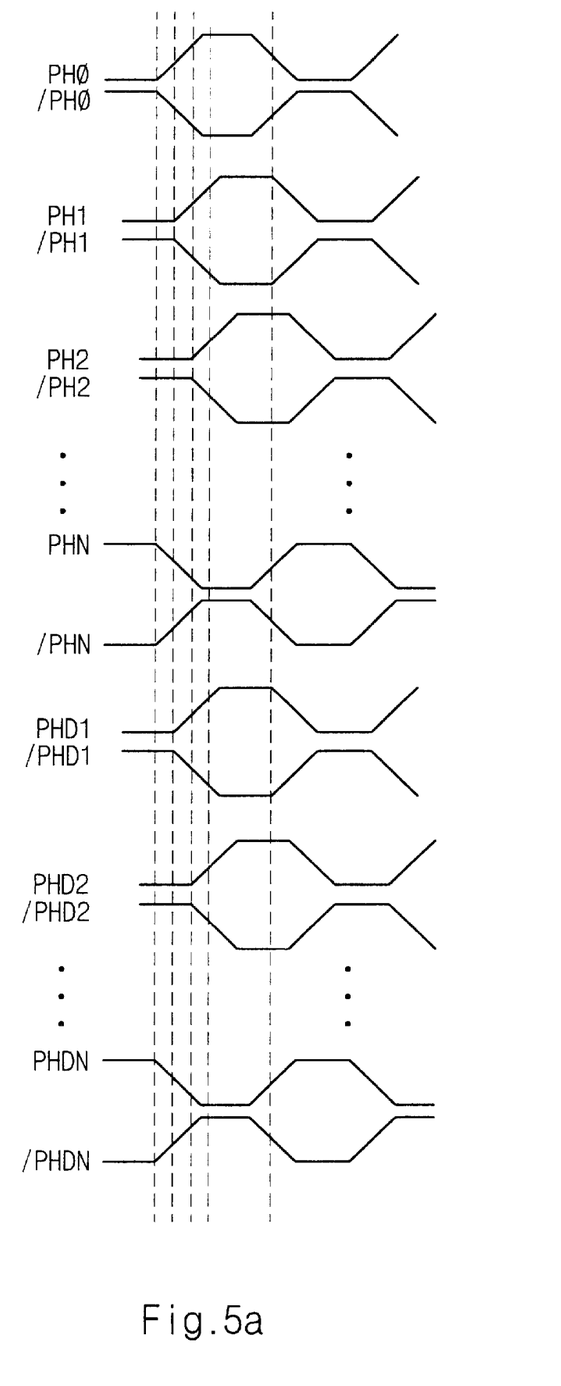
FIGS. 5a and 5b are timing diagrams illustrating a multi-phase clock signal in a coarse delay line of FIG. 4.
Figure 5B:
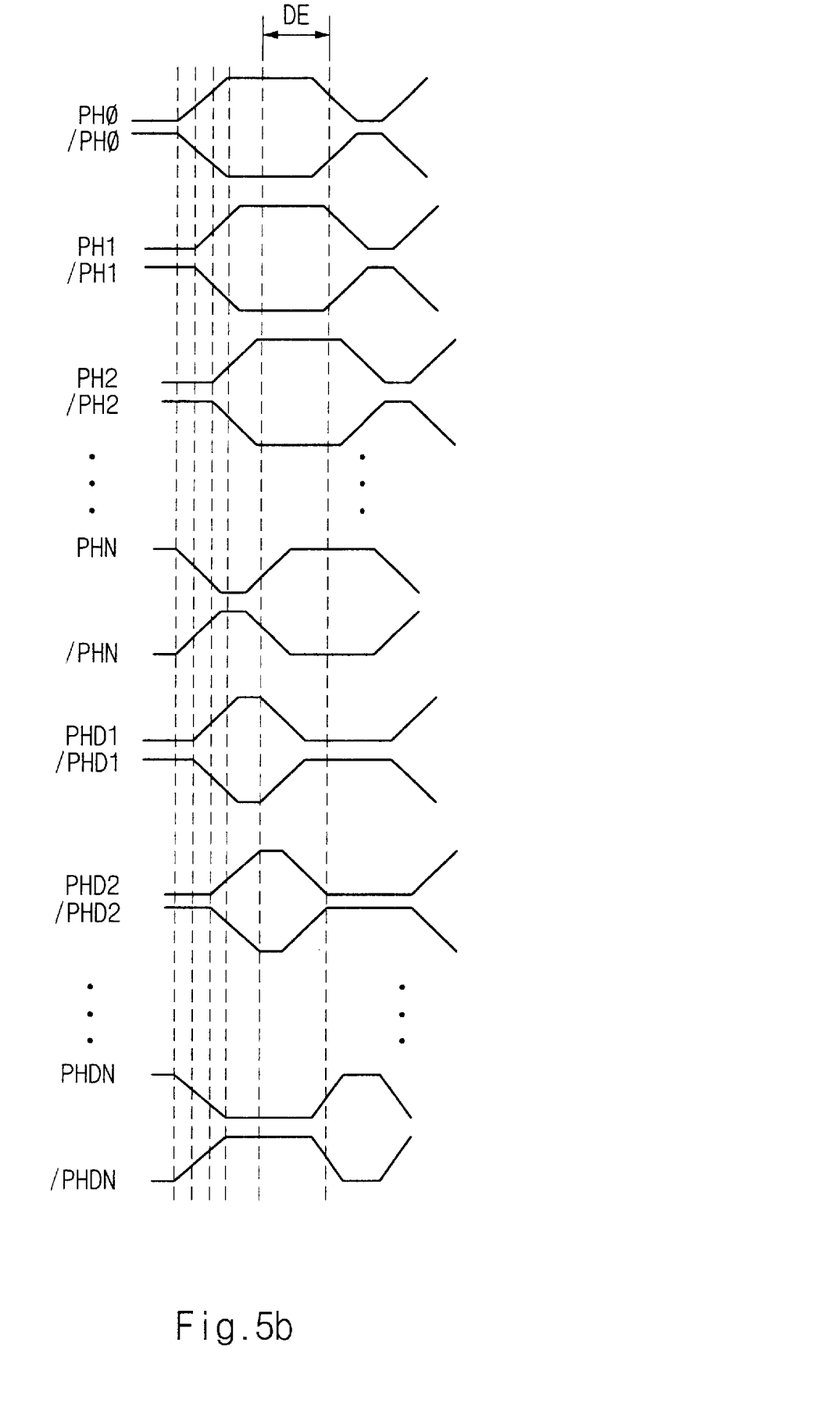

FIGS. 5a and 5b are timing diagrams illustrating multi-phase clock signals PH1–PHN, /PH1-/PHN and PHD1–PHDN, /PHD1-/PHDN in the coarse delay line 30 as compared with reference clock signals PH0, /PH0. FIG. 5a is a timing diagram when duty ratio of the external clock signal ECLK is 50%.

The differential delay cells NDEL1–NDELN sequentially delays the reference clock signal PH0 and /PH0 outputted from the clock buffer 10, and then outputs multi-phase clock signals PH1–PHN and /PH1-/PHN. The phase difference is 180° between the reference clock signal PH0 and the clock signal PHN outputted from the final differential delay cell NDELN of the normal delay line 31.

The clock signals PHN and /PHN outputted from the final differential delay cell NDELN of the normal delay line 31 are cross-inputted into input terminals of the first differential delay cell DDEL1 of the reverse delay line 32. The differential delay cells DDEL1–DDELN of the reverse delay line 32 sequentially delays the clock signals PHN and /PHN, and then outputs multi-phase clock signals PHD1–PHDN, /PHD1-/PHDN. The phase difference is 180° between the clock signal PUN outputted from the final differential delay cell NDELN of the normal delay line 31 and the clock signal PHDN outputted from the final differential delay cell DDELN of the reverse delay line 32. As a result, the phase difference is 360° between the reference clock signal PH0 and the clock signal PHDN outputted from the final differential delay cell DDELN in the reverse delay line 32.

Because the external clock signal ECLK has a duty ratio of 50%, the duty ratio is not changed although the phase difference is 180° between the reference clock signal PH0 and the clock signal PHN outputted from the final differential delay cell NDELN in the normal delay line 31. As a result, the clock signal PHN has the duty ratio of 50%, as does the clock signal PHDN.

FIG. 5b is a timing diagram when the duty ratio of the external clock signal ECLK is not 50%. The following is an explanation of an example where the time interval for the high level of the clock signal ECLK is longer than the time interval for the low level. The differential delay cells NDEL1–NDELN of the normal delay line 31 sequentially delay the reference clock signals PH0 and /PH0. The coarse delay line 30 then outputs multi-phase clock signals PH0–PHN and /PH0-/PHN. The phase difference should be 180° between the clock signal PH0 and the clock signal PHN outputted from the final differential delay cell NDELN in the normal delay line 31. Thus, the clock signal PHN outputted from the final differential delay cell NDELN in the normal delay line 31 has a high level time interval and a low level time interval opposite to that of the inverted reference clock signal /PH0. As a result, a difference DE is generated between the high level time interval of the reference clock signal PH0 and the low level time interval of the clock signal PHN. The difference DE corresponds to double the duty error, where the duty error is the difference from the point where the duty rate is at 50%.

The clock signals PHN and /PHN outputted from the final differential delay cell NDELN in the normal delay line 31 are cross-inputted into input terminals of the first differential delay cell DDEL1 in the reverse delay line 32. The differential delay cells DDEL1–DDE1N of the reverse delay line 32 sequentially delays the clock signals PHN and /PHN, and then outputs multi-phase clock signals PHD1–PHDN and /PHD1-/PHDN. The phase difference should be 180° between the clock signal PHN outputted from the normal delay line 31 and the clock signal PHDN outputted from the final differential delay cell DDELN. The clock signal PHDN outputted from the final differential delay cell DDELN in the reverse delay line 32 has the opposite high level time interval and low level time interval to that of the inverted clock signal /PHN. As a result, the difference DE is also generated between the high level time interval of the clock signal PHN outputted from the final differential delay cell NDELN and the high level time interval of the clock signal PHDN outputted from the final differential delay cell DDELN.

Figure 6:
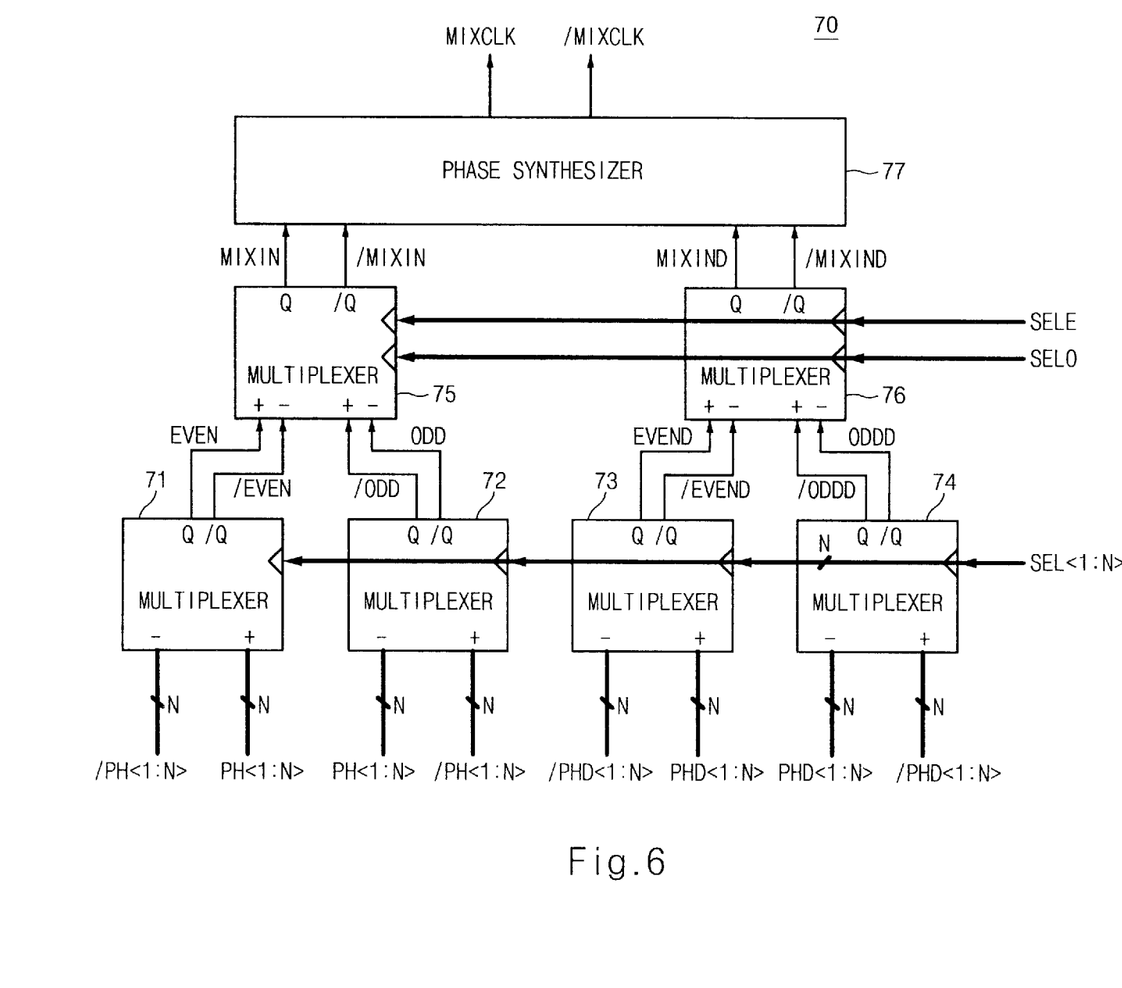
FIG. 6 is a detailed block diagram illustrating a clock interface of FIG. 3.

FIG. 6 is a detailed block diagram illustrating an example of the clock interface 70 of the clock synchronization device. The clock interface 70 comprises N by 1 multiplexers 71 to 74, 2 by 1 multiplexers 75 and 76, and a phase synthesizer 77.

The multiplexer 71 selects a pair of multi-phase clock signals EVEN and /EVEN from among the multi-phase clock signals PH1–PHN and /PH1-/PHN from the normal delay line 31 in the coarse delay line 30, according to selection signal SEL<1:N> outputted from the control unit 60. The multiplexer 72 selects a pair of multi-phase clock signals ODD and /ODD from among the multi-phase clock signals PH1–PHN and /PH1-/PHN from the normal delay line 31 in the coarse delay line 30, according to selection signal SEL<1:N> from the control unit 60. The multiplexer 73 selects a pair of multi-phase clock signals EVEND and /EVEND from among the multi-phase clock signals PHD1–PHDN and /PHD1-/PHDN from the reverse delay line 32 in the coarse delay line 30, according to selection signal SEL<1:N> from the control unit 60. The multiplexer 74 selects a pair of multi-phase clock signals ODDD and /ODDD from among the multi-phase clock signals PHD1–PHDN and /PHD1-/PHDN from the reverse delay line 32 in the coarse delay line 30, according to selection signal SEL<1:N> from the control unit 60.

The multiplexer 75 selects a pair of clock signals MIXIN and /MIXIN from among the clock signals EVEN, /EVEN and ODD, /ODD selected by the multiplexers 71 and 72, according to selection signals SELE and SELO from the control unit 60. The multiplexer 76 selects a pair of clock signals MIXIND and /MIXIND from among the clock signals EVEND, /EVEND and ODDD, /ODDD selected by the multiplexers 73 and 74, according to selection signals SELE and SELO of the control unit 60. The phase synthesizer 77 outputs a pair of clock signals MIXCLK and /MIXCLK having the middle phase of the clock signals MIXIN, /MIXIN and MIXIND, /MIXIND selected by the multiplexers 76 and 77.

Figure 7:
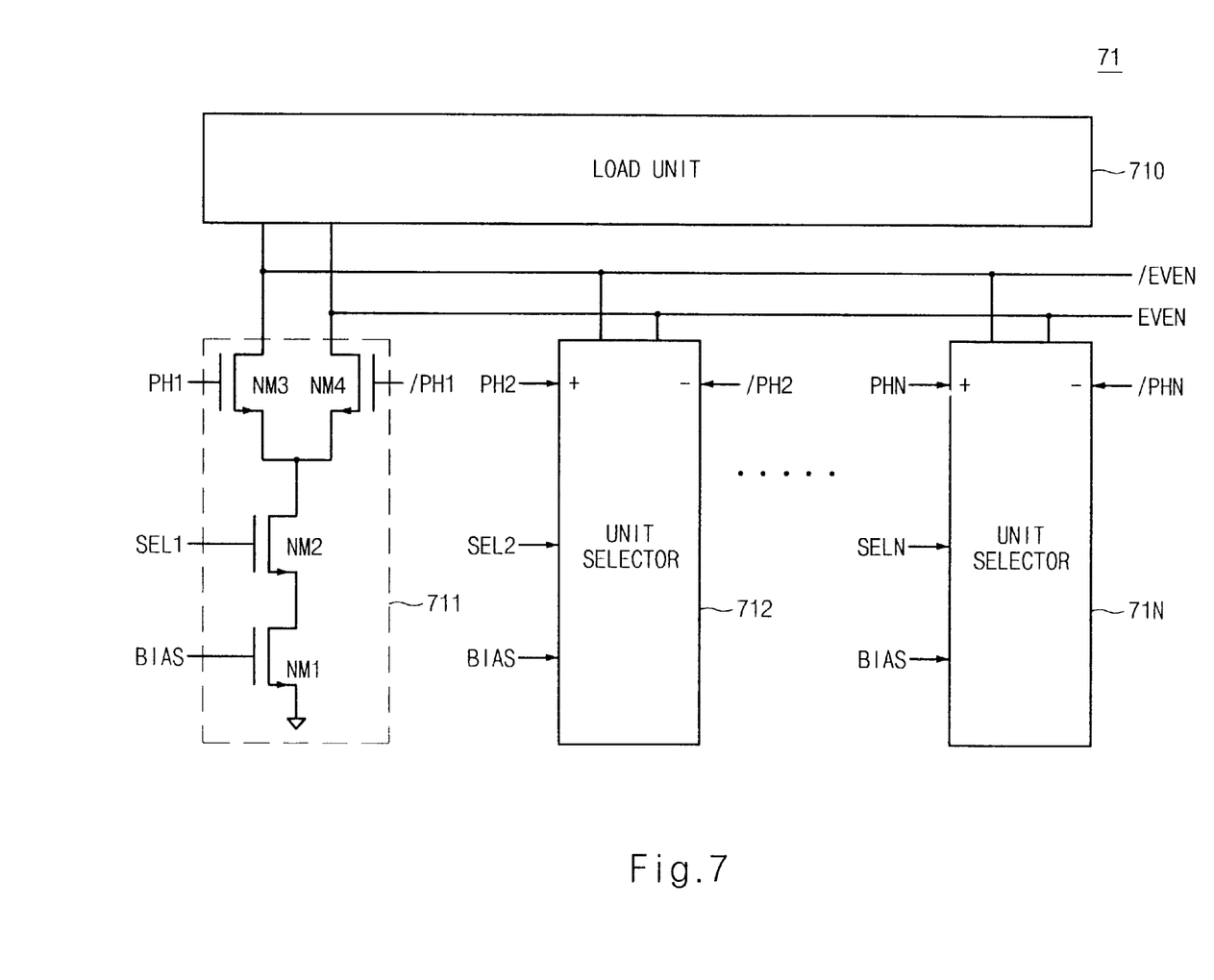
FIG. 7 is a detailed block diagram illustrating a multi-plexer of FIG. 6.

FIG. 7 is a detailed block diagram illustrating an example of the multiplexer 71 of the clock interface 70 in the clock synchronization device. The multiplexer 71 is formed from an analog selector using a constant current source. The multiplexer 71 includes several unit selectors 711 to 71N and a PMOS load unit 710 connected to the output terminals of the unit selectors 711–71N.

The unit selector 711 includes NMOS transistors NM1, NM2, NM3 and NM4. A bias voltage BIAS is applied to the gate of the NMOS transistor NM1. As a result, the NMOS transistor NM1 becomes a constant current source. A selecting signal SEL1 is applied to the gate of the NMOS transistor NM2. The common source of NMOS transistors NM3 and NM4 are connected to the drain of the NMOS transistor NM2. The drains of NMOS transistors NM3 and NM4 are connected to the PMOS load unit 710. The multi-phase clock signals PH1 and /PH1 outputted from the normal delay line 31 in the coarse delay line 30 are applied to the gates of NMOS transistors NM3 and NM4, respectively. Output terminals are formed from the sources of the NMOS transistors NM3 and NM4. The rest of the unit selectors 712–71N may have the same structure as with unit selector 711 by using a similar configuration of NMOS transistors.

Figure 8:
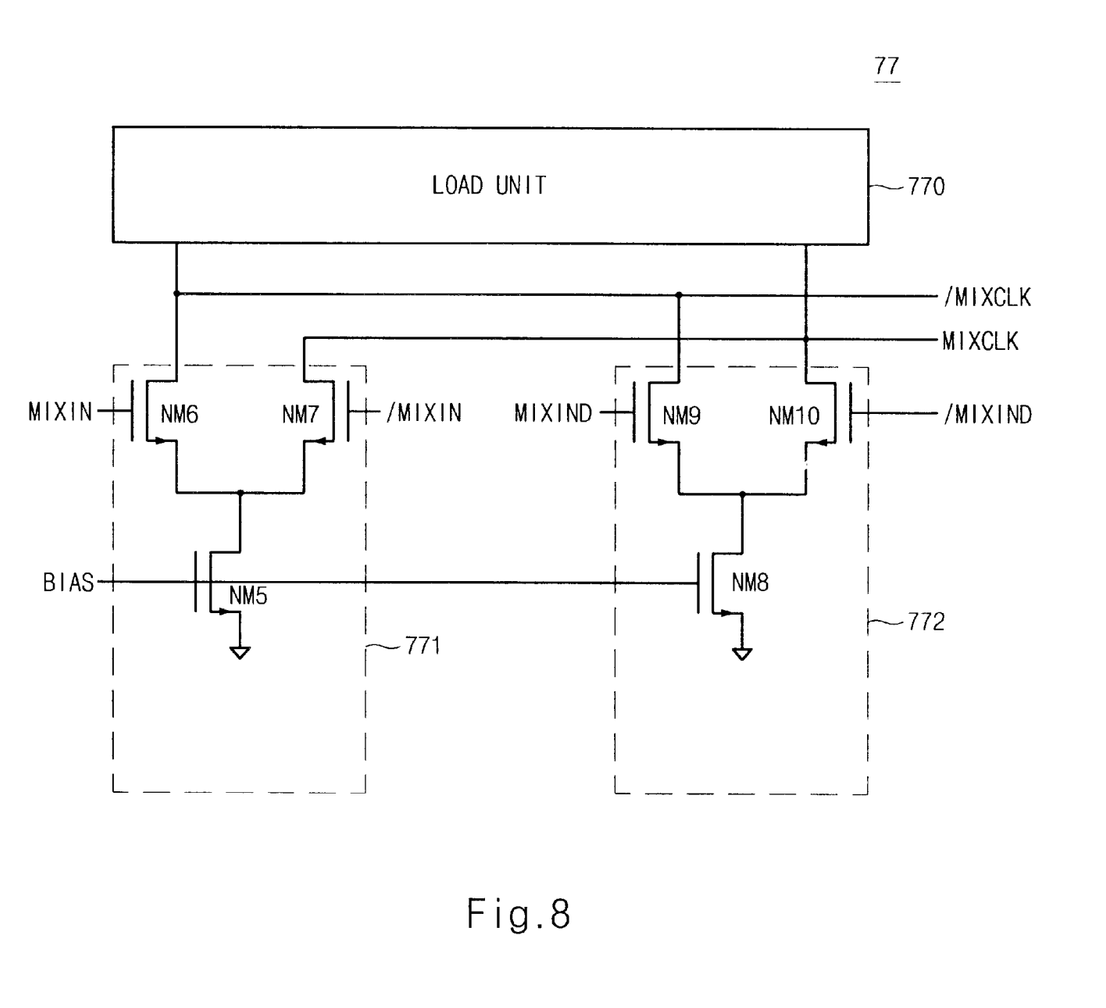
FIG. 8 is a detailed block diagram illustrating a phase synthesis unit of FIG. 6.

FIG. 8 is a detailed block diagram illustrating an example of the phase synthesis unit 77 of the clock interface 70 in the clock synchronization device. The phase synthesis unit 77 includes a normal clock signal input unit 771, a reverse clock signal input unit 772 and a PMOS load unit 770.

The normal clock signal input unit 771 includes NMOS transistors NM5, NM6 and NM7. A bias voltage BIAS is applied to the gate of the NMOS transistor NM5. As a result, the NMOS transistor NM5 becomes a constant current source. The common source of NMOS transistors NM6 and NM7 are connected to the drain of the NMOS transistor NM5. The drains of the NMOS transistor NM6 and NM7 are connected to the PMOS load unit 770. The output clock signals MIXIN and /MIXIN outputted from the multiplexer 75 are applied to the gates of NMOS transistors NM6 and NM7, respectively. Output terminals are formed from the drains of the NMOS transistors NM6 and NM7.

The reverse clock signal input unit 772 includes NMOS transistors NM8, NM9 and NM10. A bias voltage BIAS is applied to the gate of the NMOS transistor NM8. As a result, the NMOS transistor NM8 becomes a constant current source. The common source of NMOS transistors NM9 and NM10 are connected to the drain of the NMOS transistor NM8. The drains of the NMOS transistors NM9 and NM10 are connected to the PMOS load unit 770. The output clock signals MIXIND and /MIXIND outputted from the multiplexer 76 are applied to the gates of NMOS transistors NM9 and NM10, respectively. Output terminals are formed from the drains of the NMOS transistors NM9 and NM10.

Figure 9:
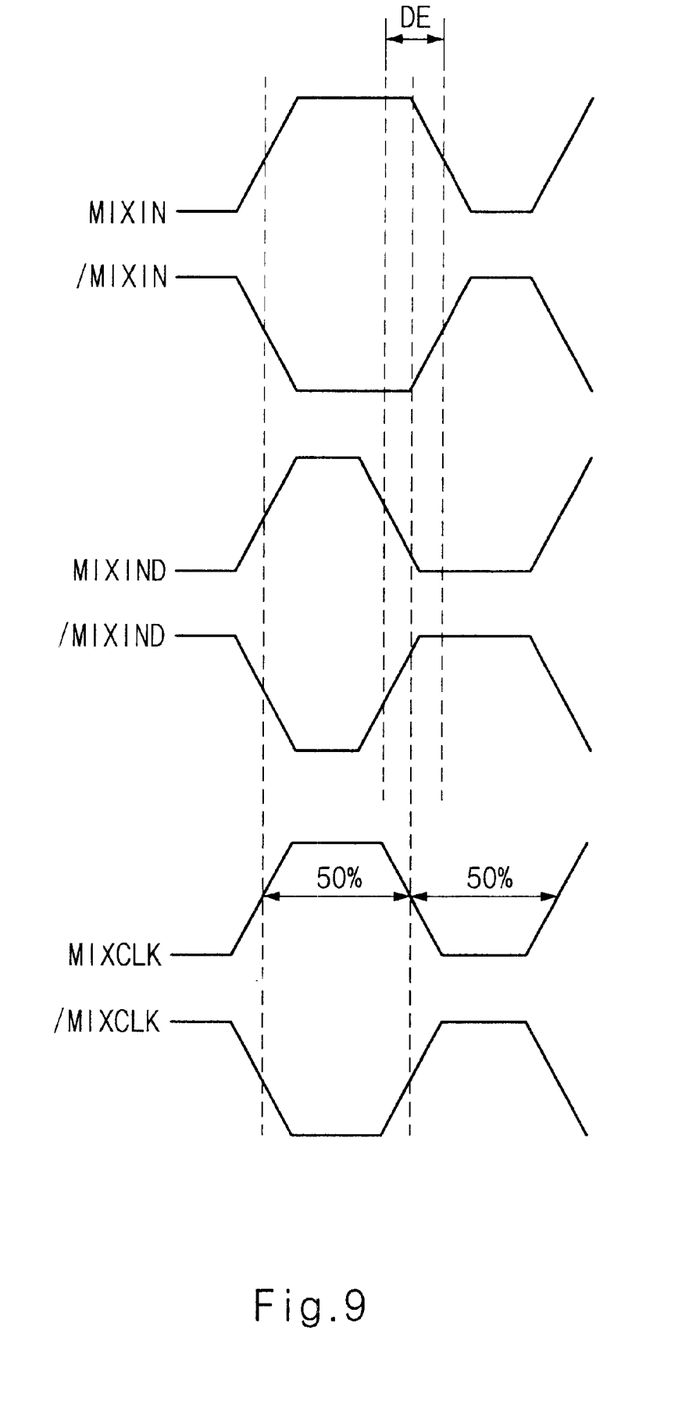
FIG. 9 is an operation timing diagram illustrating the phase synthesis of FIG. 8.

FIG. 9 is an example of an operational timing diagram illustrating the phase synthesis unit 77 of the clock interface 70 in the clock synchronization device. Because the high level time interval is longer than the low level time interval of the clock signal MIXIN in the multiplexer 75, the high level time interval becomes shorter than the low level time interval of the clock signal MIXIND outputted from the multiplexer 76. As a result, an output clock signal MIXCLK outputted from the phase synthesis unit 77 having the middle phase of the interval DE, corresponding with double the duty error, has a duty ratio of 50%, exactly.

The fine delay line 50 includes several unit fine delay cells connected in series. The fine delay line 50 finely delays and combines clock signals MIXCLK and /MIXCLK outputted from the clock interface 70 for a predetermined time, and then outputs internal clock signals ICLK. The fine control unit 40 adjusts the delay time of the fine delay line 50 according to control signal CON.

The operation of the above-described clock synchronization device is now explained. External clock signals ECLK and /ECLK are inputted into the clock buffer 10. Reference clock signals PH0 and /PH0 outputted from the clock buffer 10 are inputted into the coarse delay line 30.

The delay lines 31 and 32 of the coarse delay line 30 sequentially delay reference clock signals PH0 and /PH0, and then output multi-phase clock signals PH1–PHN, /PH1-/PHN and PHD1–PHDN, /PHD1-/PHDN, respectively. The clock signals PHN and /PHN are outputted from final differential delay cell NDELN in the normal delay line 31 and are cross-inputted into input terminals of the initial differential delay cell DDELI in the reverse delay line 32. Because the unit delay cells are of a differential type, multi-phase clock signals PH1–PHN, /PH1-/PHN and PHD1–PHDN, /PHD1-/PHDN have phases ranging from 0 to 360°.

The reference clock signal PH0 outputted from the clock buffer 10 and the clock signal /PHN outputted from the coarse delay line 30 are inputted into a phase comparator (not shown) of the coarse control unit 20. When the reference clock signal PH0 and the output clock signal /PHN are synchronized, the phase difference is 180° between the input clock signal PH0 and the output clock signal PHN. The normal delay line 31 and the reverse delay line 32 in the coarse delay line 30 are controlled according to the same enable signal EN outputted from the coarse control unit 20.

The clock interface 70 selects two pairs of differential clock signals MIXIN, /MIXIN and MIXIND, /MIXIND from among the multi-phase clock signals PH1–PHN, /PH1-/PHN and PHD1–PHDN, /PHD1-/PHDN outputted from the coarse delay line 30 to correct the duty when the duty ratio of input clock signals is not 50%. As a result, the clock signal having the phase similar to external clock signal ECLK is selected.

When the multi-phase clock signals PH1–PHN, /PH1-/PHN and PHD1–PHDN, /PHD1-/PHDN are synchronized to have a respective phase differences of 180°, the control unit 60 outputs selection signals SEL<1:N>, SELE and SEL0 so that two multiplexers of the four multiplexers 71–74 and the multiplexers 75 and 76 may simultaneously select multi-phase clock signals PH1, /PH1 and PHD1, /PHD1. The multiplexers 75 and 76 output differential clock signals MIXIN, /MIXIN and MIXIND, /MTXIND, respectively.

The differential clock signals MIXIN, /MIXIN and MIXIND, /MIXIND outputted from the multiplexers 75 and 76 are inputted into the phase synthesis unit 77. The phase synthesis unit 77 synthesizes their phases. Because two differential input terminals have the same constant current source, the phase synthesis unit 77 uniformly synthesizes the phase difference between two pairs of clock signals MIXIN, /MIXIN and MIXIND, /MIXIND, and then outputs a pair of clock signals MIXCLK and /MIXCLK having the phase corresponding with the middle phase difference between two pairs of the clock signals MIXIN, /MIXIN and MIXIND, /MIXIND. In other words, a phase difference DE of differential clock signals MIXIN, /MIXIN and MIXIND, /MIXIND in the multiplexers 75 and 76 at the falling edge is identical with double the duty error. As a result, when the phases are uniformly synthesized, clock signals MIXCLK and /MIXCLK having the duty ratio of 50% are outputted.

The clock signals MIXCLK and /MIXCLK outputted from the clock interface 70 are applied to the fine delay line 50. Internal clock signals ICLK outputted from the fine delay line 50 are inputted into a phase detector (not shown) of the control unit 60. The phase detector compares the phase of the internal clock signal ICLK with that of the reference clock signal PH0. The comparison result is outputted into a digital value.

When multi-phase clock signals PH2, /PH2 and PHD2, /PHD2 are selected, the above-described procedure is also repeated. As a result, a phase detector (not shown) of the control unit 60 outputs a digital value corresponding with the comparison result. The above-described procedures are repeated to multi-phase clock signals PH3–PHN, /PH3-/PHN and PHD3–PHDN, /PHD3-/PHDN. Thereafter, the same procedures are repeated for the non-selected multiplexers, of the four multiplexers 71–74, in the clock interface 70.

The digital value outputted from the control unit 60 is analyzed in the control unit 60 to detect a clock signal having the phase closest to that of external reference clock signal PH0. As a result, the control unit 60 adjusts selection signals SEL<1:N>, SELE and SEL0 so that the multiplexers may select clock signals having the above-described phase. Then, the fine control unit 40 operates to synchronize the phase of external clock signal PH0 with that of internal clock signal ICLK.

Figure 10:
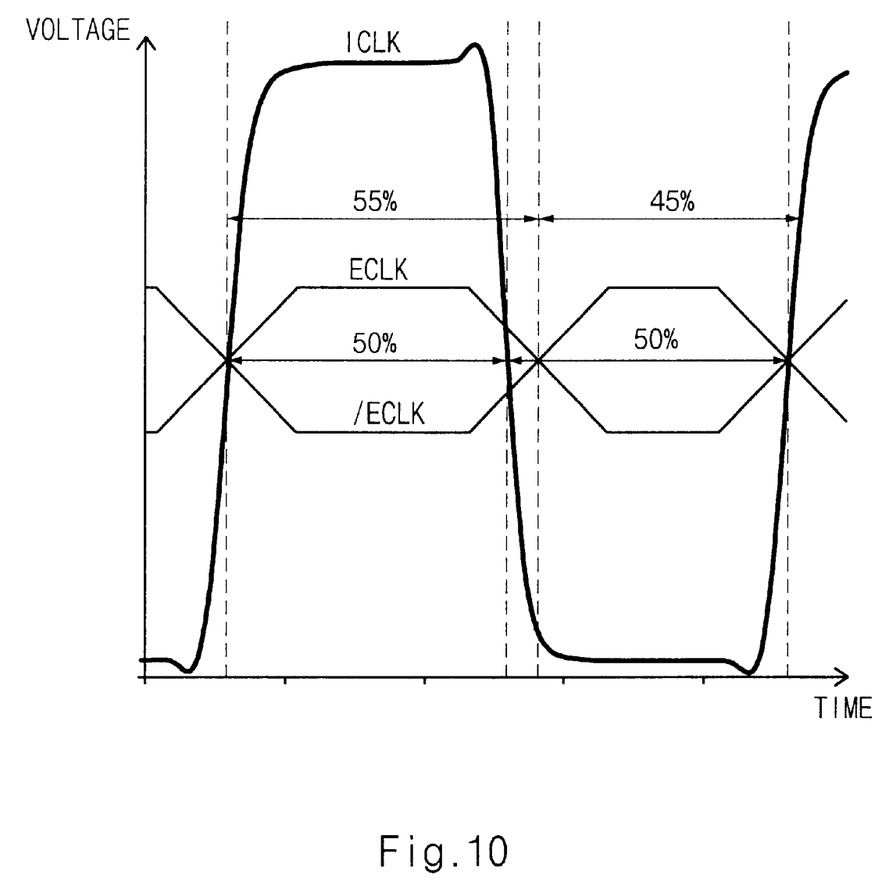
FIG. 10 is a waveform graph illustrating simulation results of FIG. 3.

FIG. 10 is a waveform graph illustrating simulated results according to the above description. When an external clock signal ECLK having duty error of 5% is inputted, the duty error of the internal clock signal ICLK is corrected and the internal clock signal ICLK is synchronized with external clock signal ECLK. As a result, the duty ratio of internal clock signal is exactly 50%.

In another example, the clock synchronization device additionally includes a feedback type duty corrector circuit which controls the independent current source of the phase synthesis unit 77 in the clock interface 70 in order to correct duty errors even more accurately.

As discussed earlier, the clock synchronization device may reduce initial synchronization time and jitter by using a feed-forward type duty error corrector circuit and constantly generating internal clock signals having a duty ratio of 50% regardless of the duty error of inputted clock signals, thereby preventing data output operation error. In addition, the disclosed clock synchronization device has an unlimited hold time when the clock synchronization device is instantly stopped.

From the foregoing, persons of ordinary skill in the art will appreciate that a clock synchronization device has been provided. Although preferred examples have been disclosed for illustrative purposes, those of ordinary skill in the art will appreciate that the scope of this patent is not limited thereto. On the contrary, this patent covers all devices and methods falling within the scope and spirit of the accompanying claims.

What is claimed is:

1. A clock synchronization device, comprising:
    a coarse delay line arranged to sequentially delay an external clock signal and output one or more pairs of first multi-phase clock signals and one or more pairs of second multi-phase clock signals;
    a coarse control unit arranged to compare the phase of the external clock signal with the phase of an inverted clock signal from among the one or more pairs of first multi-phase clock signals to provide a comparison result and further arranged to control the coarse delay line according to the comparison result;
    a clock interface arranged to select a pair of clock signals having opposite phases, from among the one or more pairs of first multi-phase clock signals and the one or more pairs of second multi-phase clock signals and further arranged to synthesize the phase of a pair of the selected clock signals;
    a fine delay line arranged to finely delay the pair of the selected clock signals from the clock interface and output an internal clock signal synchronized with the external clock signal;
    a fine control unit arranged to compare the phase of the external clock signal with the phase of the internal clock signal and further arranged to control the fine delay line according to a comparison result; and
    a control unit arranged to compare the phase of the external clock signal with that of the internal clock signal and further arranged to control the clock interface according to a digital comparison result.

2. The clock synchronization device according to claim 1, wherein the coarse delay line comprises:
    a first delay line including a plurality of first delay cells connected in series, and arranged to sequentially delay the external reference clock signals, wherein an output of each of the plurality of first delay cells forms a pair of the first multi-phase clock signals; and
    a second delay line including a plurality of second delay cells connected in series, and arranged to sequentially delay a pair of cross-inputted first multi-phase clock signals, wherein an output of each of the plurality of second delay cells forms a pair of the second multi-phase clock signals.

3. The clock synchronization device according to claim 2, wherein the first delay cell and the second delay cell have the same structure, and wherein the number of first delay cells comprising the first delay line is identical with that of the second delay cells comprising the second delay line.

4. The clock synchronization device according to claim 2, wherein the first and the second delay cells comprise differential type delay cells.

5. The clock synchronization device according to claim 1, wherein the clock interface comprises:
   a first multiplexer arranged to select one or more pairs of clock signals from among the one or more pairs of first multi-phase clock signals;
   a second multiplexer arranged to select one or more pairs of clock signals from among one or more pairs of reverse-inputted first multi-phase clock signals;
   a third multiplexer arranged to select a pair of clock signals from among the one or more pairs of second multi-phase clock signals;
   a fourth multiplexer arranged to select one or more pairs of clock signals from among one or more pairs of reverse-inputted second multi-phase clock signals;
   a fifth multiplexer arranged to select a pair of clock signals from among the pair of clock signals selected by the first multiplexer and the pair of clock signals selected by the second multiplexer;
   a sixth multiplexer arranged to select a pair of clock signals from among the pair of clock signals selected by the third multiplexer and the pair of clock signals selected by the fourth multiplexer; and
   a phase synthesizer arranged to synthesize the phase of the pair of the clock signals selected by the fifth multiplexer with the phase of the pair of the clock signals selected by the sixth multiplexer.

6. The clock synchronization device according to claim 5, wherein the first multiplexer comprises:
   a plurality of unit selectors, each having a current source, and arranged to receive the pair of the first multi-phase clock signals;
   a load unit connected to output terminals of the plurality of unit selectors and arranged to convert current values of each current source into voltage values.

7. The clock synchronization device according to claim 5, wherein the second multiplexer comprises:
   a plurality of unit selectors, each having a current source, and arranged to receive the reversed pair of the first multi-phase clock signals; and
   a load unit connected to output terminals of the plurality of unit selectors and arranged to convert current values of each current source into voltage values.

8. The clock synchronization device according to claim 5, wherein the third multiplexer comprises:
   a plurality of unit selectors, each having a current source, and arranged to receive the pair of the second multi-phase clock signals; and
   a load unit connected to output terminals of the plurality of unit selectors and arranged to convert current values of-each current source into voltage values.

9. The clock synchronization device according to claim 5, wherein the fourth multiplexer comprises:
   a plurality of unit selectors, each having a current source, and arranged to receive the reversed pair of the second multi-phase clock signals; and
   a load unit connected to common output terminals of the plurality of unit selectors and arranged to convert current values of each current source into voltage values.

10. The clock synchronization device according to claim 5, wherein the phase synthesizer comprises:
   a first input, having a current source, and arranged to receive the pair of the clock signals outputted from the fifth multiplexer;
   a second input, having a current source, and arranged to receive the pair of the clock signals outputted from the sixth multiplexer; and
   a load unit arranged to convert current values outputted from the first and the second inputs into voltage values.

* * * * *

UNITED STATES PATENT AND TRADEMARK OFFICE
CERTIFICATE OF CORRECTION

PATENT NO. : 6,677,794 B2
DATED : January 13, 2004
INVENTOR(S) : Se Jun Kim

It is certified that error appears in the above-identified patent and that said Letters Patent is hereby corrected as shown below:

<u>Title page,</u>
Item [73], Assignee, please delete "Kyoungki-Do" and insert -- Kyoungki-do -- in its place.

<u>Column 10,</u>
Line 19, please delete "of-each" and insert -- of each -- in its place.

Signed and Sealed this

Twenty-fifth Day of May, 2004

JON W. DUDAS
*Acting Director of the United States Patent and Trademark Office*